United States Patent
Porowski et al.

(10) Patent No.: US 6,329,215 B1
(45) Date of Patent: Dec. 11, 2001

(54) METHOD OF FABRICATION OF SEMICONDUCTING COMPOUNDS OF NITRIDES $A_3B_5$ OF P-AND N-TYPE ELECTRIC CONDUCTIVITY

(75) Inventors: Sylwester Porowski; Jan Jun; Tadeusz Suski, all of Warsaw; Czeslaw Skierbiszewski, Golkow Kamionka; Michal Leszczynski, Warsaw; Izabella Grzegory, Warsaw; Henryk Teisseyre, Warsaw; Jacek Baranowski, Warsaw; Elzbieta Litwin-Staszewska, Warsaw, all of (PL)

(73) Assignee: Centrum Badan Wysokocisnieniowych Polskiej Akademii Navk, Warsaw (PL)

( * ) Notice: Subject to any disclaimer, the term of this patent is extended or adjusted under 35 U.S.C. 154(b) by 0 days.

(21) Appl. No.: 09/445,166

(22) PCT Filed: Jun. 3, 1998

(86) PCT No.: PCT/PL98/00024

§ 371 Date: Dec. 6, 1999

§ 102(e) Date: Dec. 6, 1999

(87) PCT Pub. No.: WO98/56046

PCT Pub. Date: Dec. 10, 1998

(30) Foreign Application Priority Data

Jun. 6, 1997 (PL) .......................................... 320409

(51) Int. Cl.⁷ ................................................. H01L 21/00

(52) U.S. Cl. .............................................................. 438/46

(58) Field of Search ................................. 438/45, 46, 47, 438/507, 508, 509, 542, 567, 568, 569, 604; 117/952

(56) References Cited

FOREIGN PATENT DOCUMENTS

| 0541373 | 5/1993 | (EP) . |
| 9504845 | 2/1995 | (WO) . |

OTHER PUBLICATIONS

Wojdak, M. et al., "Optical and electrical properties of high temperature annealed heteroepitaxial GaN:Mg layers", Acta Physica Polonica A, vol. 92, pp. 1059–1062, Nov. 1997.*
Wojdak M Et Al: "Optical and Electrical Properties of High Temperature Annealed Heteroepitaxial Gan:Mg Layers", 26th International School on Physics of Semiconducting Compounds, Jaszowiec, Poland, Jun. 6–13, 1997, vol. 92, No. 5, pp. 1059–1062, XP002081654 ISSN 0587–4246, Acta Physica Polonica A, Nov. 1997, Inst. Phys. Polish Acad. Sci, Poland.

* cited by examiner

Primary Examiner—Keith Christianson
(74) Attorney, Agent, or Firm—Horst M. Kasper

(57) ABSTRACT

The subject of the Invention is the method of fabrication of nitride semiconductor $A_3B_5$ such as GaN, AlN, InN or their solid solutions, characterized by p- or n-type conductivity, high intensity of emitted light and high structural quality. The semiconductors obtained by this method are applied in the construction of light emitting devices, light detectors and electric current amplifiers such as for example: highly efficient blue and green light diodes, laser diodes and high power lasers, ultraviolet detectors and high temperature field transistors. The method according to the Invention is characterized by the fact that the homoepitaxial or heteroepitaxial layers of nitride semiconductors $A_3B_5$ are deposited on the conductive substrate after the introductory processing or isolating substrate, and after that the so prepared structures are located in high pressure diffusional chamber filled with the one or multi-component gas, compressed to pressure in the range 1000–20000 bar, and annealed in the temperature 1000–1800 ° C. in the prescribed time in the presence of the dopant from the external and/or internal source.

14 Claims, 2 Drawing Sheets

Figure 1:
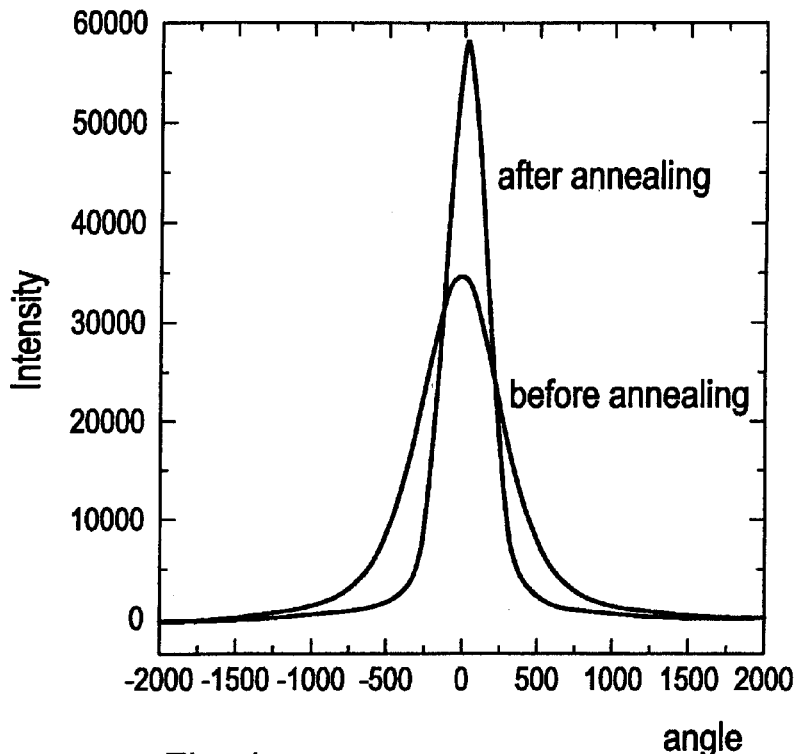

METHOD OF FABRICATION OF SEMICONDUCTING COMPOUNDS OF NITRIDES $A_3B_5$ OF P-AND N-TYPE ELECTRIC CONDUCTIVITY

FIELD OF THE INVENTION

This Invention relates to the method of fabrication nitride semiconductors $A_3B^5$ of p- and n-type electric conductivity for manufacturing of optoelectronic devices.

OBJECT AND SUMMARY OF THE INVENTION

The subject of the Invention relates to the method of fabrication of nitride semiconductors $A_3B_5$ such as GaN, AlN, InN and their solid solutions, characterized by p- and n-type electric conductivity, low electric resistivity, high intensity of emitted light and high structural quality.

The semiconductors obtained by this method are applied in the construction of optoelectronic light emitting devices, light detectors and electric current amplifiers such as e.g.: highly efficient blue and green diodes, laser diodes, high power lasers, ultraviolet detectors and high temperature field effect transistors.

The layers of nitrides $A_3B_5$ are obtained most frequently by metaloorganic chemical vapor deposition (MOCVD) on sapphire substrates. In this method the metaloorganic compound fulfills the role of the gas assuring the existence of chemical reaction leading to creation of the nitride $A_3B_5$ for example trimethylgallium and/or trimethylaluminium and ammonia are injected together with the hydrogen carrier gas to the reactor chamber where the sapphire substrate is located. Next, keeping the epitaxial growth temperature in the range 800–1000° C., the heteroepitaxial layers of nitrides $A_3B_5$ are obtained. The proper choice of the gas containing the dopant leads to the fabrication of the nitride of the prescribed type of conductivity. Silicon, substituting Ga or Al in the nitride represents the most frequently used n-type impurity i.e. donor. High concentrations of Si donors, higher than $10^{19}$ $cm^{-3}$ can be introduced without much trouble to the nitride layers. This corresponds to the similar concentration of free electrons, responsible for the electron type electric conductivity in the n-type layers.

Magnesium is commonly used as type p-type impurity i.e. acceptor. The growth of nitride Mg-doped structures is conducted in the method where hydrogen is used as carrier gas, which leads to the growth of highly resistive layers. This is consequence of the creation of electrically neutral complex defects containing $Mg^-$ acceptors and $H^+$ donors. In on order to obtain p-type conductive nitride layers, the structure containing $Mg^+$ acceptors and $H^+$ donors is annealed in the nitrogen atmosphere in the temperatures 400° C. or higher. It is known, however, that the increase of the annealing temperature increases effectiveness of the conversion of the insulating Mg-doped nonconductive layers into the p-type layers, but at the same time, the natural limitation of this method is requirement to keep this temperature below the nitride chemical decomposition temperature. For example, for GaN and the nitrogen pressures not exceeding 200 bars, T=1000–1100° C. is the maximal annealing temperature. In order to prevent the nitride decomposition during annealing, aside from the increase to the nitrogen pressure, the "cap" of $Si_3N_4$ or $SiO_2$ was used. This cap hindered the escape of nitrogen from the surface of the nitride layer, allowing the application of the annealing temperature close to 1100° C. Despite this, the problem of the obtaining of p-type layers of low resistivities has not been solved which translates into high concentration of the hole type carriers. It is difficult the overcome the limiting hole concentration of $5\times10^{17}$ $cm^{-3}$, despite that the concentration of Mg substituting Ga can be higher than $10^{19}$ $cm^{-3}$.

There exists equally known other method of fabrication of doped nitride structures $A_3B_5$. The method relies on the introduction of p- and n-type impurities into the thin subsurface nitride layer by high energy ion implantation: Mg or Ca in order to obtain p-type and Si or O ions for n-type. Sometimes, for the creation of the prescribed layer it is necessary to use the simultaneous implantation by P ions.

The implantation process leads to nonconductive, optically inactive semiconductor layers of seriously destroyed crystalline structure. In order to obtain the layers with electrically and optically active impurities it is necessary to use annealing of the implanted structures in high temperatures. It leads to removal of the radiative defects, preventing the active action of the implanted ions as an active impurities, responsible for light emission by semiconductor structure.

As stems from the presented description, the processes of the annealing of the nitride structures are used in both above mentioned methods of the creation of p-type material and in case of implantation, also for the n-type layers. In both cases, the annealing temperature cannot exceed 1000–1100° C., due to chemical instability of these materials in high temperature and low pressure. The time limitation of the annealing processes are related to the same problem of stability.

The goal of the Invention is to introduce the new method of fabrication of the structures semiconductor nitrides GaN, AlN, InN and their solid solutions, containing layers of p- and/or n-type of the improved structural quality and increased effectiveness of light emission.

The processes leading to the creation of structures of prescribed electrical, optical and structural properties follow deposition of the semiconductor layers of nitrides $A_3B_5$ on the conductive or isolating substrate of the bulk crystal (Ga,Al.,In)N or sapphire. In order to grow the layered structure, the well known MOCVD or MBE methods are used. So prepared structure is subjected to the high pressure and high temperature influence in high pressure diffusional chamber.

In connection with the above, the paramount element of the presented Invention is the execution of the controlled modification of physical properties of homoepitaxial and heteroepitaxial structures of semiconductor nitrides $A_3B_5$ deposited on the conductive substrate subjected the introductory processing or isolating substrate, in high pressure diffusional chamber filled with one or multi-component gas, compressed to pressure between 1000 and 20000 bar. This allows the execution of the doping processes to p- and n-type and modification of the structure properties in order to obtain the parts of the optoelectronic devices of increased efficiency of light emission or the low resistivity parts of electronic devices. These processes are effected in the temperature equal to 1000–1800° C.

The structures obtained in the framework of the Invention are characterized by the quality of the crystallographic structure higher than the heteroepitaxial structures obtained by annealing without pressure or under low gas pressure.

The method according to the Invention uses as the conductive substrate, the bulk crystal of semiconductive compound $A_3B_5$, annealed in high pressure, high temperature diffusional chamber in the temperature 1000–1800° C., under high pressure of single or multi-element gas in the range 1000–20000 bar in the presence of the dopant source..

The high pressure annealing, according to the Invention is effected in one component gas nitrogen or argon or in these gas mixture described by the formula z N+(1−z)Ar, where $0 \leq z \leq 1$.

As isolating substrate, the bulk semiconductor compound $A_3B_5$ crystal is used, doped with magnesium or sapphire $Al_2O_3$.

The used homoepitaxial or heteroepitaxial layers are represented by the compounds of the following chemical formula $Ga_xAl_{1-x}N$ where $0 \leq x \leq 1$ and $Ga_yIn_{1-N}$ where $0 \leq y \leq 1$.

The p- and n-type dopants are applied in various stages of the described processes. They are introduced during both growth of the isolating substrate and doping of homoepitaxial and heteroepitaxial layers. In case of the layers of p- and n-type the dopants are provided by the external and/or internal source.

The external source of the p- and n-type dopants is the piece of material containing one of the following elements: Mg, Ca, Be, Zn, Cd., Si and Ge or the chemical compound of these elements, positioned in high pressure diffusional chamber, close to the doped layers.

The internal source of the p- and n-type dopants is the epitaxial layer of the nitride semiconductor $A_3B_5$ doped with one of the following elements: Mg, Ca, Be, Zn, Cd., Si and Ge and this layer is deposited in the homoepitaxial growth process between the substrate of bulk nitride semiconductor (Ga,InAl)N and the layer deseigned to doping.

In some processes the internal source of the dopants of p- and n-type is a part of the epitaxial layer of nitride semiconductor $A_3B_5$ implanted by one of the following elements: Mg, Ca, Be, Zn, Cd., Si and Ge or their combination.

The proper choice of the annealing condition leads to creation of the layered elements characterized by the prescribed type of electric conductivity—p- and n-type, high structural quality and increased effectiveness of light emission, especially in the ultraviolet, blue and green light range. Simultaneously, the applied method assures high uniformity of the physical properties of the nitride layers, creating the described structure. This structure created the basis for the construction of the light emitting devices, light detectors and electric current amplifying devises.

The method according to the Invention is described in the examples of application and on the FIG. 1, where the Bragg x-ray reflection for the heteroepitaxial GaN layers on sapphire in the relative scale for the (0004) crystallographic planes. The narrowing of the peak for the annealed layer reflects the diminution of the mutual disorientation of various parts of the layers. The armealing was conducted in the temperature 1350° C. and under pressure of 10000 bar. The narrowing of the peak and increase if its intensity reflects the improvement of the structural properties of the layer during high pressure annealing.

Figure 2:
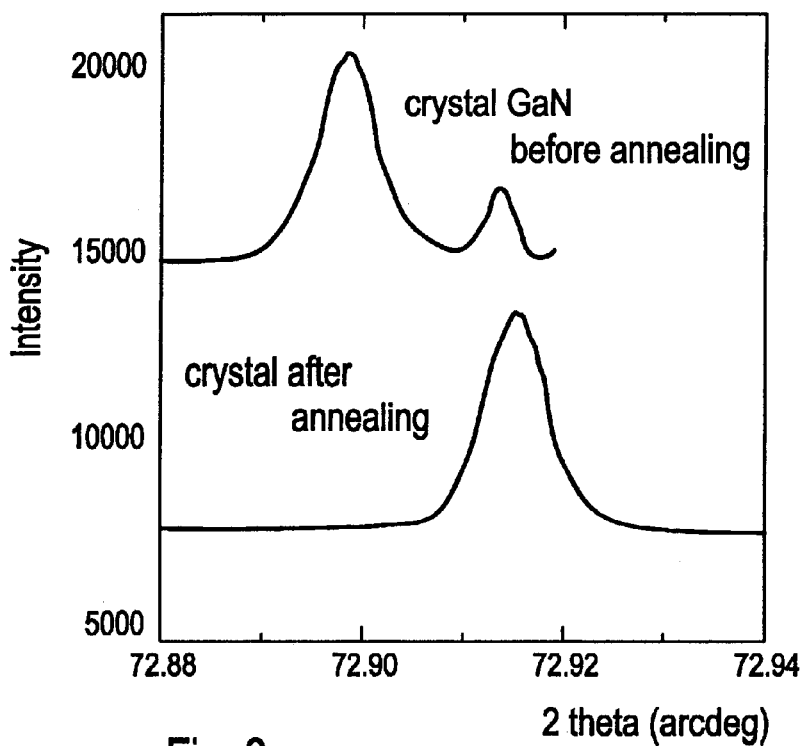

FIG. 2 presents diffraction peaks in the absolute scale. The smaller angle corresponds to larger size of the elementary cell—lattice parameters of the crystal. It is evident that the crystal before annealing has various lattice parameters, that reflects the existence of the stress. After annealing the stress disappears. This annealing was conducted in the temperature 1800° C. and pressure 20000 bar in the time of two hours.

Figure 3:
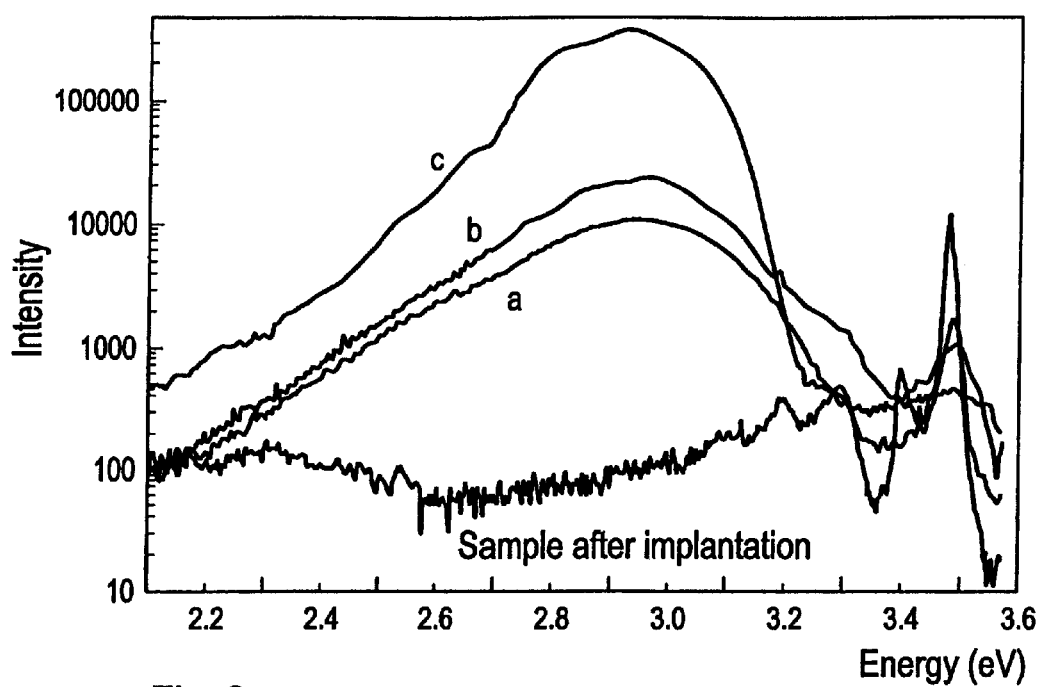

FIG. 3 presents the luminescence spectra of homoepitaxial structure Zn-doped by implantation. After implantation the light emission specific for Zn impurity, with the maximum for the energies close to 3 eV, is absent see the lowest curve on that Figure. Subsequently, the samples were subjected to the diffusion and autodiffusion processes in order to remove radiation defects, introduced during implantation. The increase of the annealing temperature: a—1200° C., b—1300° C., c—1400° C. leads to the 1000 fold increase of the light emission. The annealing was conducted in the gas mixture of 0.9 N and 0.1 Ar under pressure of 10000 bar. For all these temperature the annealing lasted 1 hour.

Figure 4:
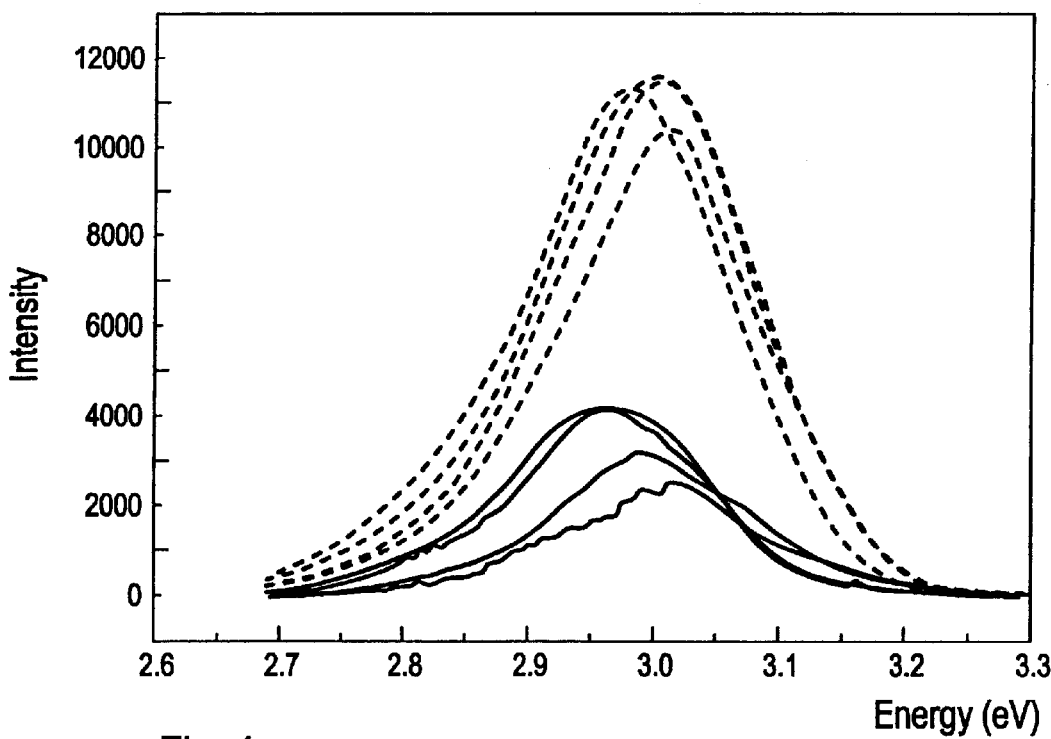

FIG. 4, on the other part, presents the luminescence spectra of the homoepitaxial structures doped with Mg in MOCVD process. The solid lines correspond to the measurements in four different location on the sample. The broken lines correspond to similar measurements made after annealing in the high pressure diffusional chamber in temperature 1450° C. and under pressure of 1500 bar of the following gas mixture: 0.8 N and 0.2 Ar. The observation indicates on the increase of the luminescence intensity, specific for Mg impurity, and homogenization of this intensity as evidenced by measurements for the various locations on the sample.

EXAMPLE 1

Method of Fabrication of p-type GaN by Diffusion of Mg from the External Source in the $N_2$ and Ar Mixture Compressed to High Pressures.

Homoepitaxial GaN structure consists of the monocrystalline semiinsulating GaN Mg-doped substrate on which the following layers are deposited by MOCVD method:

buffer layer of undoped GaN of the thickness of 20 nm
undoped GaN layer of the thickness of 1 μm.

The substrate is obtained by high pressure—high temperature growth. The homoepitaxial structure GaN/GaN is located in quasi-closed graphite container together with the piece of metallic Mg and GaN powder, which consist of 0.01 and 0.03 volume of the entire container. The container is located inside the high temperature-high pressure multi-zone furnace. The magnitude of the power of specific zones are independently controlled, in such a way that the temperature does not differ by more than 1° C. along the container.

The quasi-closed container and the multi-zone furnace is located inside high pressure diffusional chamber. The gas mixture of 0.9 $N_2$ and 0.1 Ar is used as high pressure medium and its compression was made by the external gas compressor connected by capillary with the diffusional chamber.

The pressure of the mentioned gas mixture is raised to 15000 bar and subsequently the temperature inside the container is increased to 1500° C. In these conditions Mg from the external sources sublimes and in this form arrives to the surface of the multi-layer GaN structure. The MG diffusion in the external GaN layer lasts 20 minutes, and afterwards the system is cooled down to the room temperature.

After extraction of the described GaN structure from high pressure diffusional chamber, the following measurements of undoped GaN structure have been made: Hall effect, electric conductivity, halfwidth of x-ray diffraction peak and photoluminescence at T=80 K.

The layer has the following properties:

electric conductivity of p-type, with the hole concentration measured by Hall effect equal to $1.5 \times 10^{17}$ cm$^{-3}$ and hole mobility 3 cm$^2$/Vs;

the width of Bragg (0002) reflection FWHN equal to 40 arcsec and high uniformity along the layer photoluminescence at 80 K is characterized by broad band with the maximum for 3 eV. This is typical luminescence for the Mg-doped GaN structures.

EXAMPLE 2
Method of Fabrication GaN Structures of Improved Structural and Optical Properties by Zn Implantation and High Pressure Diffusion and Autodiffusion Homoepitaxial GaN structure consists of the monocrystalline conducting GaN n-type substrate on which the following layers are deposited by MOCVD method:

buffer layer of undoped GaN of the thickness of 100 nm undoped GaN layer of the thickness of 1 $\mu$m.

The substrate is obtained by high pressure high temperature growth.

Zn impurity is implanted in room temperature, using the ion energy 200 keV and the total intensity equal to $5 \times 10^{13}$ cm$^{-2}$. After the implantation, the layer did not show any luminescence for T=80 K and had FWHM=400 arcsec.

The so prepared homoepitaxial structure GaN/GaN is located in quasi-closed graphite container. The conditions of the annealing high pressure process were identical to those in Example 1 except the changes made in the following parameters: duration—1 hour, temperature—1400° C. $N_2$ and Ar pressure—12000 bar, there was no additional Zn source in the container.

After extraction of the described GaN structure from high pressure diffusional chamber, the following measurements of undoped GaN structure have been made: Hall effect, electric conductivity, halfwidth of x-ray diffraction peak and photoluminescence at T=80 K.

The layer has the following properties:
the width of Bragg (0002) reflection FWHN equal to 200 arcsec and high uniformity along the layer photoluminescence at 80 K is characterized by broad band with the maximum for 3 eV. This is typical luminescence for the Zn-doped GaN structures.

EXAMPLE 3
Method of Fabrication of p-type GaN Structures of Improved Structural and Optical Properties by Mg Implantation and High Pressure Diffusion and Autodiffusion Homoepitaxial GaN structure is prepared as in Example 1. Mg impurity is implanted in room temperature, using the ion energy 200 keV and the total intensity $5 \times 10^{13}$ cm$^{-2}$. After the implantation, the layer did not show any luminescence for T=80 K and had FWHM=450 arcsec.

Subsequently the so prepared homoepitaxial structure GaN/GaN is located in quasiclosed graphite container The conditions of the process were identical to those in Example 2 except the temperature—1350° C. In the container there was no additional source of Mg.

After extraction of the described GaN structure from high pressure diffusional chamber, the following measurements of undoped GaN structure have been made: Hall effect, electric conductivity, halfwidth of x-ray diffraction peak and photoluminescence at T=80 K.

The layer has the following properties:
electric conductivity of p-type, with the hole concentration measured by Hall effect equal to $2 \times 10^{17}$ cm$^{-3}$ and hole mobility 4 cm$^2$/Vs;

the width of Bragg (0002) reflection FWHN equal to 250 arcsec and high uniformity along the layer photoluminescence at 80 K is characterized by broad band with the maximum for 3 eV. This is typical luminescence for the Mg-doped GaN structures.

Similar results can be obtained for the implantation of the layer by the other elements, namely Ca. In case of implantation by Si the material obtained has n-type electric conductivity with the electron concentration measured by Hall effect equal to $2 \times 10^{18}$ cm$^{-3}$ and electron mobility 150 cm$^2$/Vs

EXAMPLE 4
Method of Fabrication of p-type GaN Structures of Improved Structural and Optical Properties by Mg Diffusion from Mg-doped Homoepitaxial Layers Homoepitaxial GaN structure consists of the monocrystalline semiinsulating GaN Mg-doped substrate on which the following layers are deposited by MOCVD method:

buffer layer of undoped GaN of the thickness of 20 nm

Mg-doped GaN layer of the thickness of 1 $\mu$m.

undoped GaN layer of the thickness of 1 $\mu$m.

protective $Si_3N_4$ cap layer of the thickness of 20 nm

The substrate is obtained by high pressure—high temperature growth. The homoepitaxial structure GaN/GaN is located in quasi-closed graphite container together with GaN powder, which consist of 0.03 volume of the entire container. The conditions of the process were identical to those in Example 3. In these conditions during 30 minutes of annealing process Mg impurity diffused from the doped layer to the undoped layer.

After extraction of the described GaN structure from high pressure diffusional chamber, the protective $Si_3N_4$ cap layer and the GaN layer below of the thickness of 11 $\mu$m is removed by etching. Then the following measurements of undoped GaN structure have been made: Hall effect, electric conductivity, halfwidth of x-ray diffraction peak and photoluminescence at T=80 K.

The layer has the following properties:
electric conductivity of p-type, with the hole concentration measured by Hall effect equal to $2.5 \times 10^{17}$ cm$^{-3}$ and hole mobility 4 cm$^2$/Vs;

the width of Bragg (0002) reflection FWHN equal to 60 arcsec and high uniformity along the layer photoluminescence at 80 K is characterized by broad band with the maximum for 3 eV. This is typical luminescence for the Mg-doped GaN structures.

EXAMPLE 5
Method of Fabrication of p-type GaN Structures by Mg Diffusion from Mg-doped Substrate to Undoped Homoepitaxial GaN Layers Homoepitaxial GaN structure consists of the monocrystalline semiinsulating GaN Mg-doped substrate on which the following layers are deposited by MOCVD method:

Mg-doped GaN layer of the thickness of 1 $\mu$m.

undoped GaN layer of the thickness of 1 $\mu$m.

protective $Si_3N_4$ cap layer of the thickness of 20 nm

The substrate is obtained by high pressure—high temperature growth. Then the homoepitaxial structure GaN/GaN is located in quasi-closed graphite container and annealed in the conditions identical to those in Example 4 except that the duration of the annealing is changed to 120 minutes.

After extraction of the described GaN structure from high pressure diffusional chamber, the protective $Si_3N_4$ cap layer and the GaN layer below of the thickness of 1 $\mu$m is removed by etching. Then the following measurements of originally undoped GaN structure have been made: Hall effect, electric conductivity, halfwidth of x-ray diffraction peak and photoluminescence for T=80 K.

The layer has the following properties:
electric conductivity of p-type, with the hole concentration measured by Hall effect equal to $1 \times 10^{17}$ cm$^{-3}$ and hole mobility 3 cm$^2$/Vs;

the width of Bragg (0002) reflection FWHN equal to 60 arcsec and high uniformity along the layer photoluminescence at 80 K is characterized by broad band with the maximum for 3 eV. This is typical luminescence for the Mg-doped GaN structures.

EXAMPLE 6
Method of Fabrication of Homoepitaxial GaN Structures of Improved Structural and Optical Properties by High Pressure Diffusion and Autodiffusion Homoepitaxial GaN structure consists of the monocrystalline conductive GaN n-type substrate on which the following layers are deposited by MOCVD method:
buffer layer of undoped GaN of the thickness of 20 nm
undoped GaN layer of the thickness of 1 $\mu$m.

The substrate is obtained by high pressure—high temperature growth. Then the homoepitaxial structure GaN/GaN is located in quasi-closed graphite container and annealed during 60 minutes in temperature T=1000° C. and pressure p=1000 bar.

After extraction of the described GaN structure from high pressure diffusional chamber, the following measurements of originally undoped GaN structure have been made: Hall effect, electric conductivity, halfwidth of x-ray diffraction peak and photoluminescence for T=80 K.

The layer has the following properties:
the width of Bragg (0002) reflection FWHN decreases from 45 arcsec to 35 arcsec and high uniformity along the layer is preserved photoluminescence at 80 K is characterized by narrow donor bound exciton peak with the maximum for 3.47 eV, the luminescence bands for lower energies are absent This is typical luminescence for intentionally undoped GaN structures. The FWHN for exciton peaks decreases from 18 meV before annealing to 10 meV after high pressure processing.

EXAMPLE 7
Method of Fabrication of Heteroepitaxial GaN Structures of Improved Structural and Optical Properties by High Pressure Diffusion and Autodiffusion Heteroepitaxial GaN structure consists of the sapphire $Al_2O_3$ substrate, with the (0001) crystallographic plane serving as the growth plane, on which the following layers are deposited by MOCVD method:
buffer layer of undoped GaN of the thickness of 20 nm
undoped GaN layer of the thickness of 1 $\mu$m or 1 $\mu$m. thick GaN layer doped with Mg, Ca, Be, Zn, Cd., C, Si, Ge.

Then the homoepitaxial structure GaN/GaN is located in quasi-closed graphite container and annealed in the conditions described in the Example 6.

After extraction of the described GaN structure from high pressure diffusional chamber, the following measurements of originally undoped GaN structure have been made: Hall effect, electric conductivity, halfwidth of x-ray diffraction peak and photoluminescence at T=80 K.

The layer has the following properties:
the width of Bragg (0002) reflection FWHN decreases from 350 arcsec to 250 arcsec and high uniformity along the layer is preserved. Before the process the fluctuation of FWHM for the entire layer were ±50 arc sec, after the process ±20 arc sec.

photoluminescence at 80 K is characterized by narrow donor bound exciton peak with the maximum for 3.47 eV, the luminescence bands for lower energies are absent This is typical luminescence for undoped GaN structures. The FWHN for exciton peaks decreases from 20 meV before annealing to 13 meV after high pressure processing. The results obtained with the layers doped with Mg, Ca, Zn, Cd., C, Si, Ge were qualitatively similar.

EXAMPLE 8
Method of Fabrication of Uniform Semiinsulating GaN Single Crystals of Improved Structural and Optical Properties by High Pressure Diffusion and Autodiffusion Homoepitaxial GaN Mg-doped crystal is obtained by high pressure—high temperature growth. The crystal has the form of hexagonal plate of the dimensions 5×4×0.3×mm. The material is characterized by the resistivity equal to $10^4$ $\Omega$cm. Then the selected GaN crystal is located in quasi-closed graphite container and annealed in the conditions described in the Example 1.

After extraction of the described GaN structure from high pressure diffusional chamber, the following measurements have been made: electric resistivity, halfwidth of x-ray diffraction peak and photoluminescence at T=80 K.

The layer has the following properties:
the width of Bragg (0002) reflection FWHN decreases from 35 arcsec to 25 arcsec and high uniformity along the layer is observed the electric resistivity increases to $5 \times 10^4$ $\Omega$cm in the room temperature photoluminescence at 80 K is characterized by broad band with the maximum for 3 eV. This is typical luminescence for the Mg-doped GaN samples.

EXAMPLE 9
Method of Fabrication of Uniform Conductive GaN Single Crystals of Improved Structural and Optical Properties by High Pressure Diffusion and Autodiffusion Homoepitaxial GaN undoped crystal is obtained by high pressure—high temperature growth. The crystal has the form of hexagonal plate of the dimensions 9×8×0.4 mm. The material is characterized by the resistivity equal to $10^{-1}$ $\Omega$cm and the conductive electron concentration $4 \times 10^{19}$ $cm^{-3}$ and electron mobility $\mu$=50 $cm^2$/Vs. Then the selected GaN crystal is located in quasi-closed graphite container and in the conditions described in the Example 6 except that the temperature T=1 800° C. and pressure p=20000 bar.

After extraction of the crystal from high pressure diffusional chamber, the following measurements of undoped GaN structure have been made: electric resistivity, halfwidth of x-ray diffraction peak and photoluminescence at T=80 K.

The layer has the following properties:
the width of Bragg (0002) reflection FWHN decreases from 50 arcsec to 35 arcsec and high uniformity along the layer is preserved the electric resistivity is about $0.5 \times 10^{-1}$ $\Omega$cm in the room temperature and the electron concentration in the conduction band equal to $1 \times 10^{19}$ $cm^{-3}$ and electron mobility in room temperature $\mu$=80 cm2/Vs.

We claim:

1. A method of fabrication of nitride semiconductor compound III–V (Ga, Al, In)N comprising the steps of depositing a epitaxial layer of nitride semiconductors III–V on a substrate;

disposing the epitaxial layer on the substrate in a high-pressure diffusion chamber filled with a gas compressed to a high pressure in the range 1000–20000 bar;

locating a source close to the epitaxial layer deposited on the substrate;

subjecting the epitaxial layer deposited on the substrate to a doping procedure; and annealing the epitaxial layers at a temperature of from about 1000 to 1800 degrees centigrade for the a predetermined time period in the presence of a conductivity supporting dopant furnished by the source.

2. The method of fabrication of nitride semiconductor compound III–V (Ga, Al, In)N according to claim 1, wherein the electronic conductivity type is p.

3. The method of fabrication of nitride semiconductor compound III–V (Ga, Al, In)N according to claim 1, wherein the electronic conductivity type is n.

4. The method of fabrication of nitride semiconductor compound III–V (Ga, Al, In)N according to claim 1, wherein the substrate is electrically conducting.

5. The method of fabrication of nitride semiconductor compound III–V (Ga, Al, In)N according to claim 1, wherein the substrate is electrically nonconducting.

6. The method of fabrication of nitride semiconductor compound III–V (Ga, Al, In)N according to claim 1, wherein the gas is a single component gas.

7. The method of fabrication of nitride semiconductor compound III–V (Ga, Al, In)N according to claim 1, wherein the gas is a multi-component gas.

8. The method of fabrication of nitride semiconductor compound III–V (Ga, Al, In)N according to claim 1, wherein the source is an external source.

9. The method of fabrication of nitride semiconductor compound Ill-V (Ga, Al, In)N according to claim 8, wherein the external source is a piece of a material containing an element selected from the group consisting of Mg, Ca, Zn, Cd, C, Si, Ge and mixtures thereof.

10. The method of fabrication of nitride semiconductor compound III–V (Ga, Al, In)N according to claim 1, wherein the source is an internal source.

11. The method of fabrication of nitride semiconductor compounds III–V (Ga, Al, In)N according to claim 10, wherein the nitride semiconductor compound III–V (Ga, Al, In)N is GaN.

12. The method of fabrication of nitride semiconductor compounds III–V (Ga, Al, In)N according to claim 11, wherein the substrate is a bulk nitride semiconductor (Ga, Al, In)N; wherein the source is a layer source; wherein the material of the layer source is disposed in a homoepitaxial growth process between the bulk nitride semiconductor (Ga, Al, In)N and the epitaxial layer to be doped.

13. The method of fabrication of nitride semiconductor compounds III–V (Ga, Al, In)N, of the electronic conductivity of p- and n-type, comprising the steps of depositing epitaxial layers of nitride semiconductors III–V on a conductive substrate or on insulating substrate, locating the structure in a high-pressure diffusional chamber filled with the single- or multi-component gas compressed to high pressure in the range 1000–20000 bar, and step of annealing in temperature 1000–1800° C. in the prescribe time in the presence of the p- or n-type dopants from the external and/or internal source, characterized by using as the external source of the dopants the piece of the material containing one of the following elements: Mg, Ca, Zn, Cd, C, Si, Ge or their compounds, located close to the layer deposited on the substrate and subjected to the doping procedure.

14. The method of fabrication of nitride semiconductor compounds III–V GaN, of the electric conductivity of p- and n-type, comprising the steps of depositing epitaxial layers of nitride semiconductors III–V on a conductive substrate or on insulating substrate, locating the structure in a high-pressure diffusional chamber filled with the single- or multi-component gas compressed to high pressure in the range 1000–2000 bar, and step of annealing in temperature 1000–1800° C. in the prescribed time in the presence of the p- or n-type dopants from the external and/or internal source, characterized by using as the internal source of dopants the layer of the nitride semiconductor III–V doped with one of the following elements: Mg, Ca, Zn, Cd, C, Si, Ge and that this layer source is deposited (in the homoepitaxial growth process) between the substrate of the bulk nitride semiconductor (Ga, Al, In)N and the layer designed to doping.

* * * * *